(12) United States Patent
An

(10) Patent No.: US 8,456,933 B2
(45) Date of Patent: *Jun. 4, 2013

(54) SEMICONDUCTOR MEMORY APPARATUS AND METHOD FOR GENERATING PROGRAMMING CURRENT PULSE

(75) Inventor: Yong Bok An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

This patent is subject to a terminal disclaimer.

(21) Appl. No.: 12/983,058

(22) Filed: Dec. 31, 2010

(65) Prior Publication Data

US 2011/0261612 A1    Oct. 27, 2011

(30) Foreign Application Priority Data

Apr. 26, 2010    (KR) .................. 10-2010-0038323

(51) Int. Cl.
*G11C 7/00*    (2006.01)
(52) U.S. Cl.
USPC ............. 365/189.16; 365/148; 365/230.06
(58) Field of Classification Search
USPC ............. 365/148, 158, 163, 171, 189.14, 365/189.16, 230.06
See application file for complete search history.

(56) References Cited

U.S. PATENT DOCUMENTS

| 5,428,568 A | 6/1995 | Kobayashi et al. |
| 7,633,802 B2 * | 12/2009 | Mokhlesi ............... 365/185.18 |
| 7,706,189 B2 * | 4/2010 | Dong et al. ............ 365/185.19 |
| 7,937,630 B2 * | 5/2011 | Mori ........................... 714/718 |
| 2008/0151625 A1 | 6/2008 | Mitani et al. |
| 2009/0129140 A1 | 5/2009 | Kawazoe et al. |
| 2011/0261611 A1 * | 10/2011 | An ............................. 365/163 |
| 2012/0081953 A1 * | 4/2012 | An ............................. 365/163 |
| 2012/0081979 A1 * | 4/2012 | An ......................... 365/189.16 |

FOREIGN PATENT DOCUMENTS

| JP | 06-058995 | 3/1994 |
| KR | 1020040075033 A | 8/2004 |
| KR | 1020050120485 A | 12/2005 |
| KR | 100773095 B1 | 10/2007 |
| KR | 1020080081656 A | 9/2008 |

* cited by examiner

*Primary Examiner* — Gene Auduong
(74) *Attorney, Agent, or Firm* — William Park & Associates Patent Ltd.

(57) ABSTRACT

A semiconductor apparatus includes a first write control code generation unit configured to generate first write control codes which have fixed value for a first time and are cyclically updated after the first time, a second write control code generation unit configured to generate a second write control code, and a data write unit configured to output a first programming current pulse in response to the first write control codes, or a second programming current pulse in response to the second write control code.

19 Claims, 12 Drawing Sheets

SEMICONDUCTOR MEMORY APPARATUS AND METHOD FOR GENERATING PROGRAMMING CURRENT PULSE

CROSS-REFERENCES TO RELATED APPLICATION

The present application claims priority under 35 U.S.C. §119(a) to Korean application number 10-2010-0038323, filed on Apr. 26, 2010, in the Korean Intellectual Property Office, which is incorporated herein by reference in its entirety.

BACKGROUND

1. Technical Field

The present invention relates to a semiconductor memory apparatus, and more particularly, to a technology for generating a programming current pulse.

2. Related Art

A phase change random access memory (PCRAM) is a non-volatile memory apparatus which programs a memory cell through a programming current pulse.

A PCRAM has a characteristic of a non-volatile memory and may achieve a random access. Also, the PCRAM may be highly integrated at a low cost. The PCRAM stores data by using a phase change material. Specifically, the PCRAM stores data by using a phase change of a phase change material according to a temperature condition, that is, a change in a resistance value according to a phase change.

A phase change material can change to an amorphous state or a crystalline state according to a temperature condition. A representative phase change material is a chalcogenide alloy. A representative chalcogenide alloy is $Ge_2Sb_2Te_5$ composed of germanium (Ge), antimony (Sb), and tellurium (Te). Hence, a phase change material is generally called a "GST".

A PCRAM causes a reversible phase change of a phase change material (GST) between a crystalline state and an amorphous state by using Joule heating generated when a current is applied to the phase change material (GST) under certain conditions. In a known art, the crystalline state is referred to as a "set state". In the set state, the phase change material (GST) has a small resistance value. Also, the amorphous state is referred to as a "reset state". In the reset state, the phase change material (GST) has a larger resistance value than that in the set state. That is to say, the PCRAM stores data through a change in a resistance value between the crystalline state and the amorphous state, and determines a level of the stored data by sensing a current flowing through the phase change material (GST) or a voltage change depending on a current change. In the known art, the set state is defined as a logic level of '0', and the reset state is defined as a logic level of '1'. A state of the phase change material (GST) may be continuously maintained even though power is interrupted.

Meanwhile, the amorphous state and the crystalline state of the phase change material (GST) may be mutually changed by a programming current pulse. A set programming current pulse is a programming current which changes the phase change material (GST) of a memory cell to the set state, and a reset programming current pulse is a programming current which changes the phase change material (GST) of the memory cell to the reset state.

As the phase change material (GST) is rapidly cooled after being heated to, for example, a temperature higher than a melting temperature for a certain time by the supply of the reset programming current pulse, the phase change material (GST) is changed to the amorphous state. Also, as the phase change material (GST) is slowly cooled after being heated to, for example, a temperature higher than a crystallization temperature and lower than the melting temperature for a certain time by the supply of the set programming current pulse, the phase change material (GST) is changed to the crystalline state. Meanwhile, because a resistance value can vary depending upon a ratio of an amorphous volume to a crystalline volume of the phase change material (GST), a memory cell can be configured in a multi-level form. In the known art, a large current is flowed as the reset programming current pulse for a time shorter than the set programming current pulse, and a small current is flowed as the set programming current pulse for a time longer than the reset programming current pulse. That is to say, the state of the phase change material (GST) is changed by Joule heating under a certain condition, which is generated due to the supply of the programming current pulse.

FIG. 1 is a diagram illustrating a memory cell of a known PCRAM.

Referring to FIG. 1, a memory cell includes a cell diode D1 and a phase change element GST.

An example of the basic operations of the PCRAM configured as mentioned above will be described below.

First, an operation for programming data to the phase change element GST is performed as follows.

When a word line WL is activated to a low level, e.g., a ground voltage, and a certain voltage for a program operation begins to be applied through a bit line BL, since a cell diode D1 becomes a forward biased state, the cell diode D1 is turned on from when a voltage difference between the anode and the cathode of the cell diode D1 is higher than a threshold voltage. As a result, a current path for the program operation is formed among the bit line BL, the phase change element GST, and the word line WL. Therefore, by supplying a programming current pulse corresponding to data to be programmed to the phase change element GST through the bit line BL, the phase change element GST can be changed to the crystalline state or the amorphous state. Here, if the data to be programmed has a logic level of '1', the phase change element GST may be changed to a reset state by supplying a reset programming current pulse, and if the data to be programmed has a logic level of '0', the phase change element GST may be changed to a set state by supplying a set programming current pulse. As mentioned above, the reset state as the amorphous state has a larger resistance value than the set state as the crystalline state.

Also, an operation for detecting the data programmed to the phase change element GST is performed as follows.

When the word line WL is activated to the low level, e.g., the ground voltage, and a certain voltage for a read or a verification operation ("a read operation") begins to be applied through the bit line BL, since the cell diode D1 becomes the forward biased state, the cell diode D1 is turned on from when the voltage difference between the anode and the cathode of the cell diode D1 is higher than the threshold voltage. As a result, a current path for the read operation is formed among the bit line BL, the phase change element GST, and the word line WL. Therefore, when a certain voltage or a certain current for the read operation is applied to the phase change element GST through the bit line BL, an amount of current flowing through the phase change element GST or the magnitude of a voltage drop in the phase change element GST varies depending upon the resistance value of the phase change element GST. Therefore, data stored in the phase change element GST is discriminated.

FIG. 2 is a configuration diagram of a data write unit of a known PCRAM.

Referring to FIG. 2, a data write unit includes a current control section 10, a current driving section 20, and a selection section 30.

The current control section 10 is configured to control a voltage level of a control node N1 in response to a set control signal SETP and a reset control signal RESETP when a write enable signal WDEN is activated. Current driving forces of an NMOS transistor MN1 controlled by the set control signal SETP and an NMOS transistor MN2 controlled by the reset control signal RESETP may be designed to be different from each other. The set control signal SETP and the reset control signal RESETP may be inputted in a pulse type.

The current driving section 20 is configured to drive a programming current pulse I_PGM with a magnitude corresponding to in the voltage level of the node N1, to an output terminal N2. The programming current pulse I_PGM can be classified into a set programming current pulse corresponding to the set control signal SETP and a reset programming current pulse corresponding to the reset control signal RESETP.

The selection section 30 is configured to output the programming current pulse I_PGM, driven from the current driving section 20, to bit lines BL0 through BL3 which respectively correspond to a plurality of select signals YSW<0:3>.

FIG. 3 is a graph showing programming current pulses which are outputted from the data write unit of FIG. 2.

Referring to FIG. 3, it is to be appreciated that a reset programming current pulse is driven for a short time to be higher than a melting temperature and a set programming current pulse is driven for a long time when compared to the reset programming current pulse, to be lower than the melting temperature. For reference, in the drawing, the reset programming current pulse is shown as an amorphizing pulse, and the set programming pulse is shown as a crystallizing pulse.

SUMMARY

In an exemplary embodiment of the present invention, a semiconductor memory apparatus includes a first write control code generation unit configured to generate first write control codes which have fixed value for a first time and are cyclically updated after the first time, a second write control code generation unit configured to generate a second write control code, and a data write unit configured to output a first programming current pulse in response to the first write control codes, or a second programming current pulse in response to the second write control code.

In another exemplary embodiment of the present invention, a semiconductor memory apparatus further includes a cycle control signal output unit configured to output a cycle control signal, wherein the first write control code generation unit changes an update cycle of the first write control codes in response to the cycle control signal.

In yet another exemplary embodiment of the present invention, a method for generating a programming current pulse in a semiconductor memory apparatus configured to program data to a memory cell through Joule heating induced by a programming current pulse includes the steps of generating first write control codes which are cyclically updated, and outputting a first programming current pulse which has a magnitude corresponding to a code combination of the first write control codes, wherein the first programming current pulse raises and maintains a temperature of a memory cell for a first time to a temperature lower than a melting temperature and higher than a crystallization temperature, and gradually lowers a temperature of the memory cell for a second time after the first time to a temperature lower than the crystallization temperature.

In yet another exemplary embodiment of the present invention, a semiconductor memory apparatus includes a quenching control code generation unit configured to generate a binary quenching control code which has more first values at a beginning of a program operation than at an end of the program operation, and a data write unit configured to generate a program current in response to the binary quenching control code.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a method for generating a programming current pulse according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry.

Figure 1:
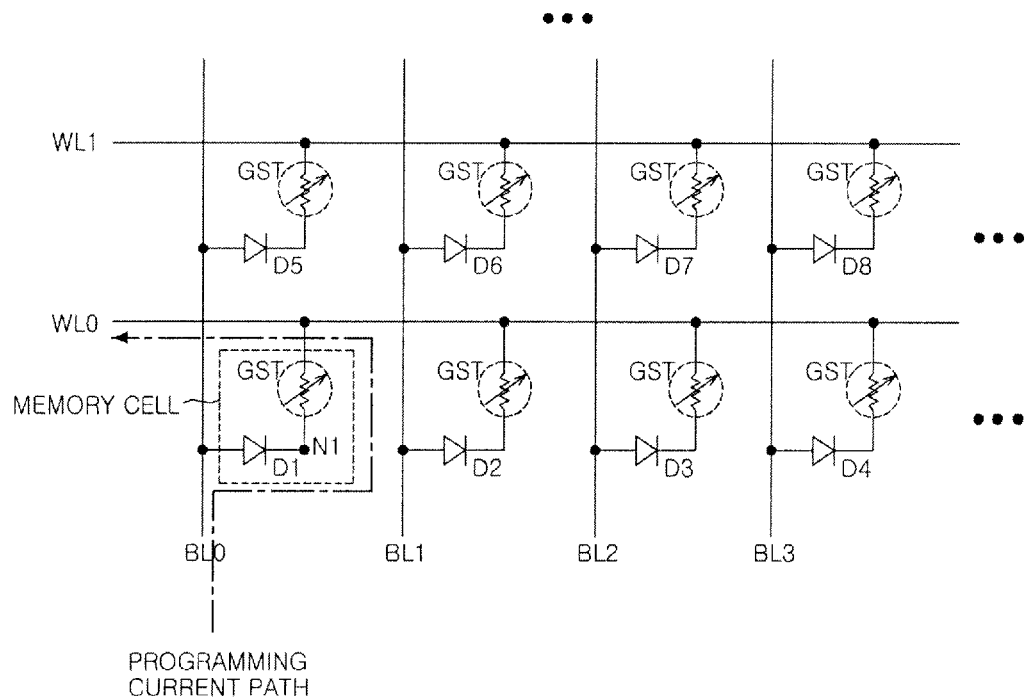
FIG. 1 is a diagram illustrating a memory cell of a known PCRAM.
Figure 2:
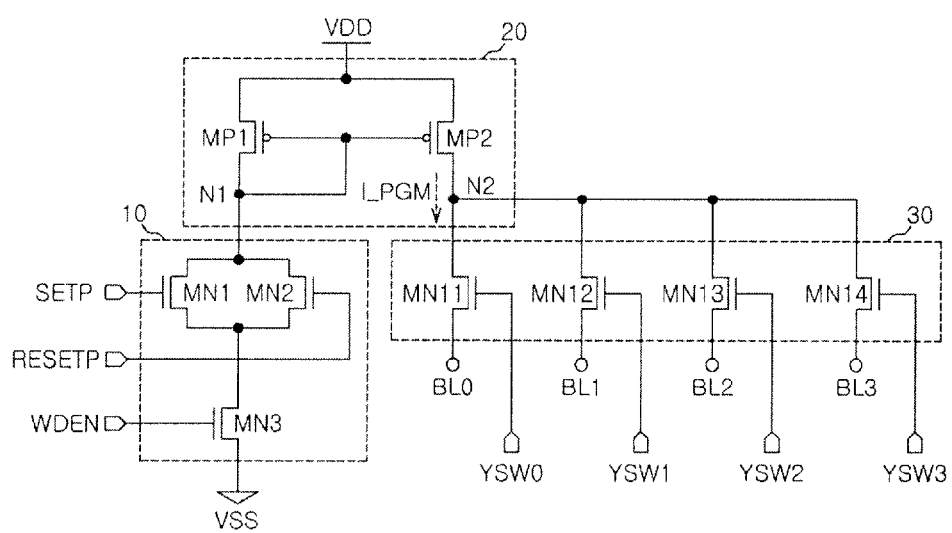
FIG. 2 is a configuration diagram of a data write unit of the known PCRAM.
Figure 3:
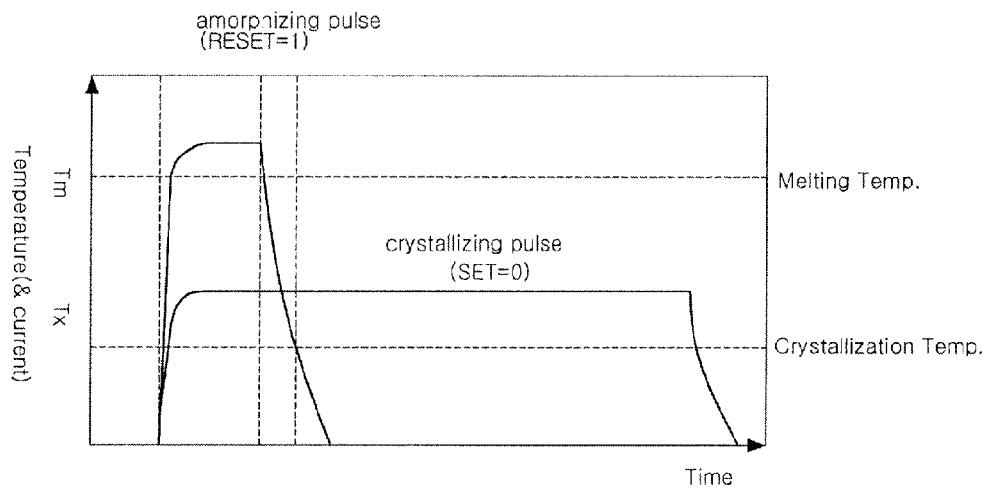
FIG. 3 is a graph showing programming current pulses which are outputted from the data write unit of FIG. 2.
Figure 4:
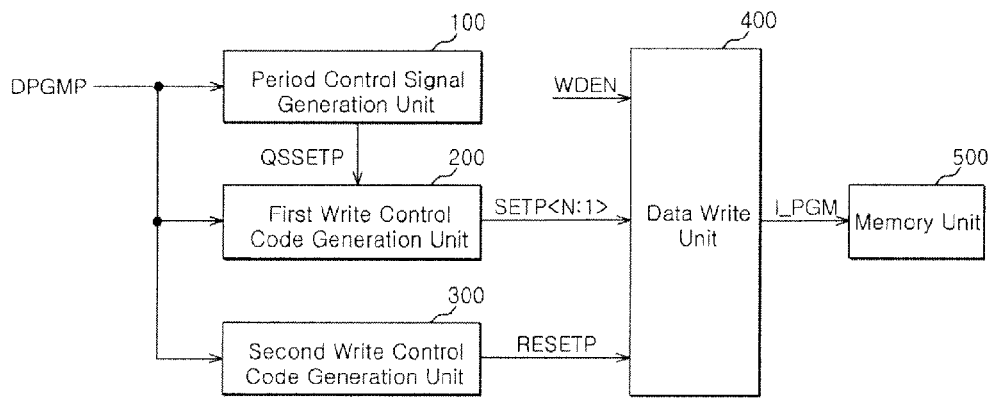
FIG. 4 is a configuration diagram illustrating a semiconductor memory apparatus in accordance with an exemplary embodiment of the present invention.

FIG. 4 is a configuration diagram illustrating a semiconductor memory apparatus in accordance with an exemplary embodiment of the present invention.

The semiconductor memory apparatus in accordance with the present exemplary embodiment of the invention includes only a simplified configuration for the sake of clear description of essential characteristics.

Referring to FIG. 4, a semiconductor memory apparatus includes a period control signal generation unit 100, a first write control code generation unit 200, a second write control code generation unit 300, and a data write unit 400.

The principal operations of the semiconductor memory apparatus configured as mentioned above will be described below.

The period control signal generation unit 100 is configured to generate a period control signal QSSETP which is activated after a first time, in response to a programming enable signal DPGMP. That is to say, the period control signal QSSETP is activated after the first time from an activation timing of the programming enable signal DPGMP. Therefore, the first time may be a duration for applying an initial "set" current which is the largest current of the "set" current.

The first write control code generation unit 200 is configured to generate first write control codes SETP<N:1> which are cyclically updated in correspondence to counting codes for a second time, in response to the programming enable signal DPGMP. The first write control code generation unit 200 activates a function for the update of the first write control codes SETP<N:1>, when the period control signal QSSETP is activated.

The second write control code generation unit 300 is configured to generate a second write control code RESETP which is activated for a certain time, in response to the programming enable signal DPGMP.

The data write unit 400 is configured to output a programming current pulse I_PGM which has a magnitude corresponding to a code combination of the updated first write control codes SETP<N:1> or a magnitude corresponding to the second write control code RESETP. The programming current pulse I_PGM can be classified into a first programming current pulse corresponding to the first write control codes SETP<N:1> or a second programming current pulse corresponding to the second write control code RESETP. The programming current pulse I_PGM outputted from the data write unit 400 is transferred to a memory unit 500 and is supplied to a corresponding memory cell selected among a plurality of memory cells.

Figure 5:
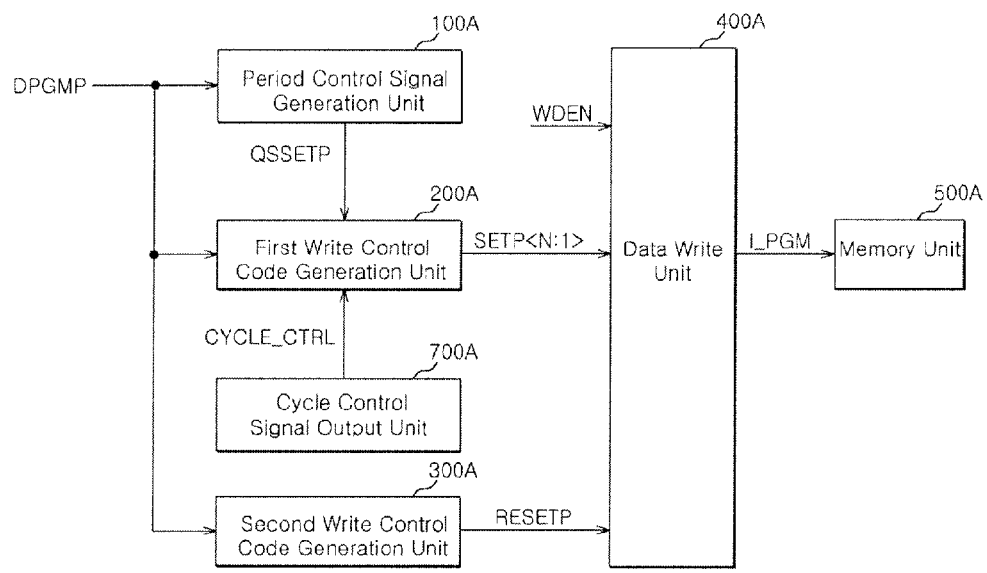
FIG. 5 is a configuration diagram illustrating a semiconductor memory apparatus in accordance with another exemplary embodiment of the present invention.

FIG. 5 is a configuration diagram illustrating a semiconductor memory apparatus in accordance with another exemplary embodiment of the present invention.

The semiconductor memory apparatus in accordance with the present exemplary embodiment of the invention includes only a simplified configuration for the sake of clear description of essential characteristics.

Referring to FIG. 5, a semiconductor memory apparatus includes a period control signal generation unit 100A, a first write control code generation unit 200A, a cycle control signal output unit 700A, a second write control code generation unit 300A, and a data write unit 400A.

The principal operations of the semiconductor memory apparatus configured as mentioned above will be described below.

The period control signal generation unit 100A is configured to generate a period control signal QSSETP which corresponds to the configuration codes SCODE<N:1> and is activated after a first time, in response to a programming enable signal DPGMP. That is to say, the period control signal QSSETP is activated after the first time from an activation timing of the programming enable signal DPGMP.

The cycle control signal output unit 700A is configured to to output a cycle control signal CYCLE_CTRL.

The first write control code generation unit 200A is configured to generate first write control codes SETP<N:1> which are cyclically updated for a second time, in response to the programming enable signal DPGMP. The first write control code generation unit 200A activates a function for the update of the first write control codes SETP<N:1> when the period control signal QSSETP is activated. Also, the first write control code generation unit 200A changes an update cycle of the first write control codes SETP<N:1> in response to the cycle control signal CYCLE_CTRL.

The second write control code generation unit 300A is configured to generate a second write control code RESETP which is activated for a certain time, in response to the programming enable signal DPGMP.

The data write unit 400A is configured to output a programming current pulse I_PGM which has a magnitude corresponding to a code combination of the updated first write control codes SETP<N:1> or a magnitude corresponding to the second write control code RESETP. The programming current pulse I_PGM can be classified into a first programming current pulse corresponding to the first write control codes SETP<N:1> or a second programming current pulse corresponding to the second write control code RESETP. The programming current pulse I_PGM outputted from the data write unit 400A is transferred to a memory unit 500A and is supplied to a corresponding memory cell selected among a plurality of memory H) cells.

Figure 6A:
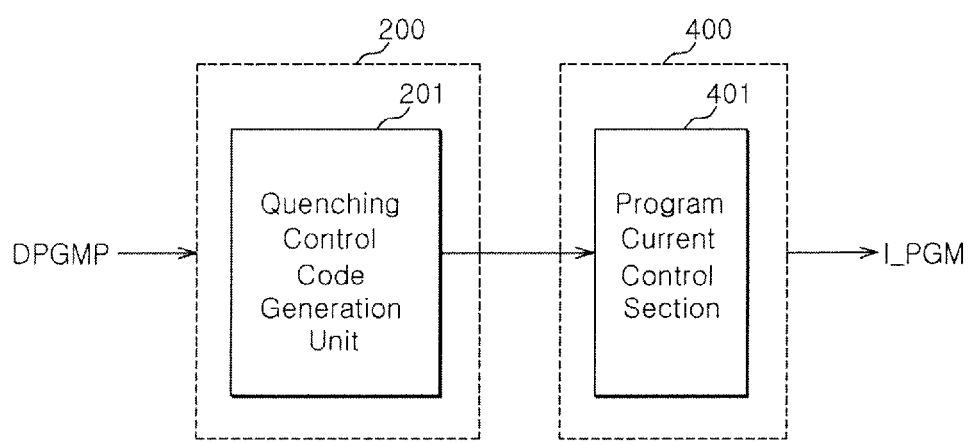
FIG. 6A is a configuration diagram illustrating an exemplary embodiment of the first write control code generation unit and the data write unit.

FIG. 6A is a configuration diagram illustrating an exemplary embodiment of the first write control code generation unit and the data write unit.

Referring to FIG. 6A, the write control code generation unit 200 includes a quenching control code generation unit 201, and the data write unit includes a program current control section 401. Here, the quenching control code generation unit 201 is configured to generate a quenching control code which controls a set programming current pulse such that a set programming current decreases linearly during a certain time. The quenching control code generation unit 201 may include a counter, e.g., a counter of which an output value decreases (a down counter). In this case, the program current control section 401 may include a plurality of NMOS pass gates which pass the set programming current, and are arranged in parallel. Here, for example, all of the plurality of NMOS pass gate pass the set programming current in response to maximum output value of the quenching control code generation unit (e.g., 111111), and none of the plurality of NMOS pass gate pass the set programming current in response to a minimum output value of the quenching control code generation unit (e.g., 000000)

Figure 6B:
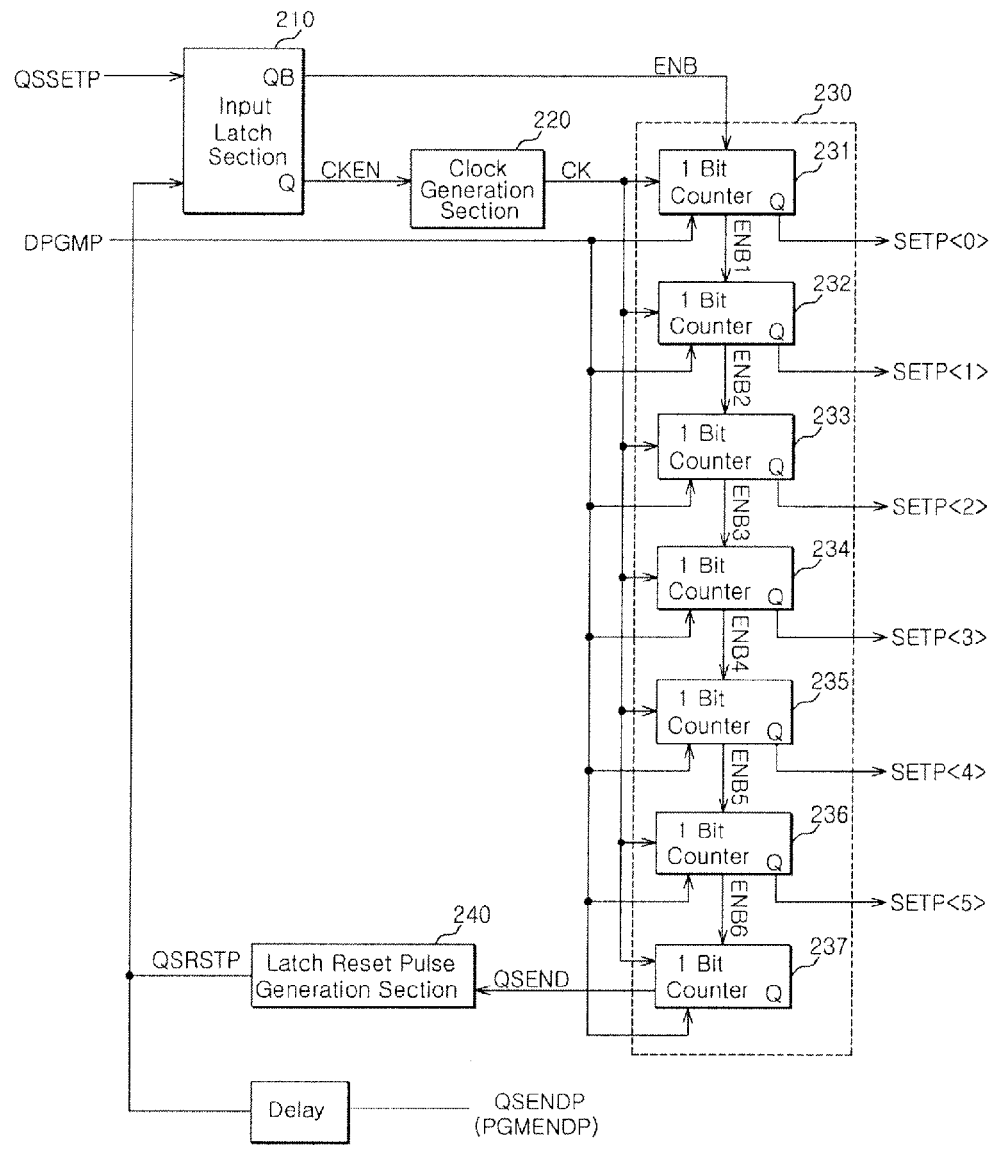
FIG. 6B is a configuration diagram illustrating an exemplary embodiment of a first write control code generation unit.

FIG. 6B is a configuration diagram illustrating an exemplary embodiment of the first write control code generation unit.

Referring to FIG. 6B, the write control code generation unit 200 includes an input latch section 210, a clock generation section 220, a counter section 230, and a latch reset pulse generation section 240.

The principal operations and detailed configuration of the first write control code generation unit 200 configured as mentioned above will be described below in detail.

Figure 7:
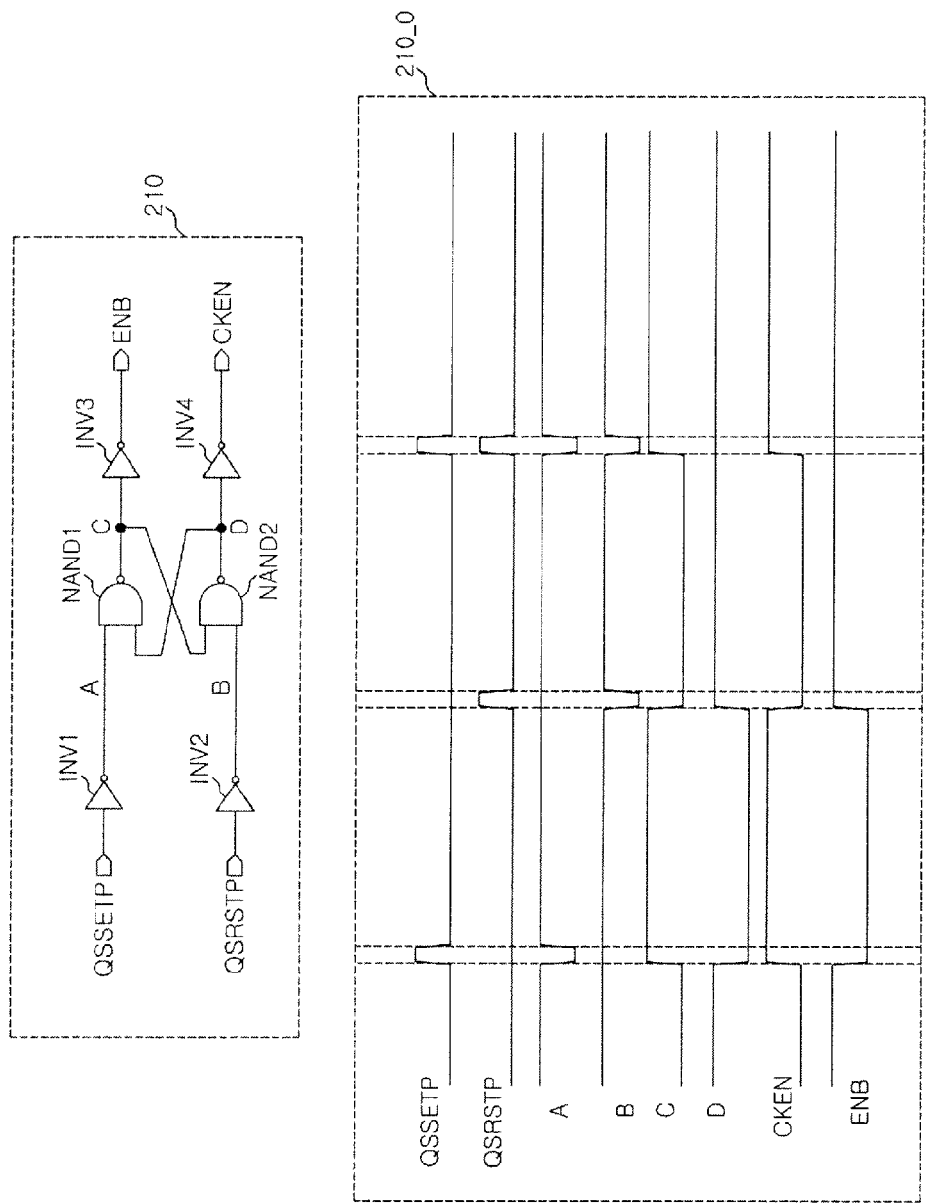
FIG. 7 is an exemplary configuration diagram of an input latch section of the first write control code generation unit shown in FIG. 6 and a timing diagram illustrating internal operations of the input latch section.

FIG. 7 is a configuration diagram of the input latch section of the first write control code generation unit shown in FIG. 6B and a timing diagram illustrating internal operations of the input latch section.

Referring to FIG. 7, the input latch section 210 includes an RS latch which is composed of a plurality of NAND gates NAND1 and NAND2. Referring to a timing diagram 210_0, the input latch section 210 outputs a count enable signal ENB and a clock enable signal CKEN in response to the period control signal QSSETP and a latch reset pulse signal QSRSTP. In other words, if the period control signal QSSETP pulses to a high level, the count enable signal ENB is activated to a low level, and the clock enable signal CKEN is activated to a high level.

Figure 8:
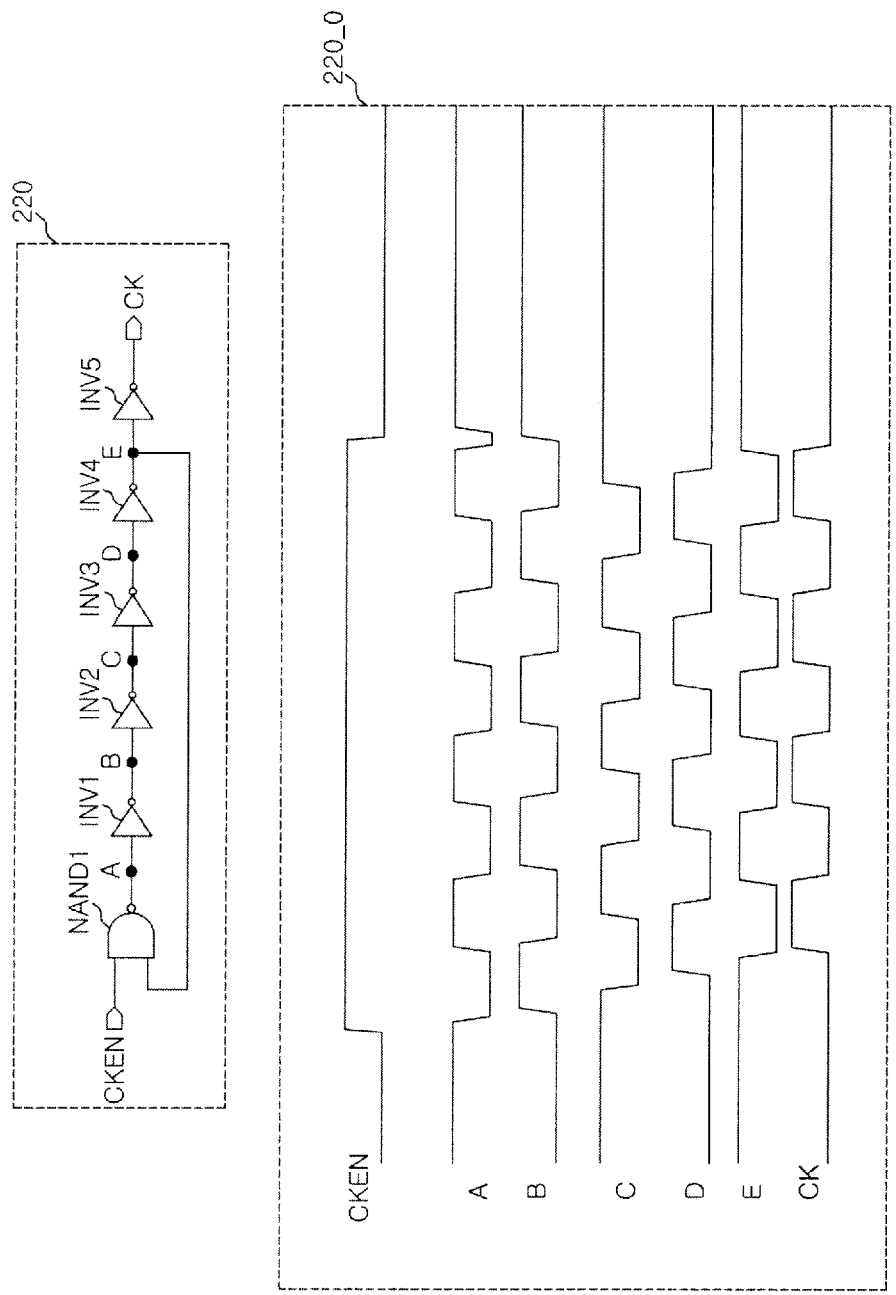
FIG. 8 is an exemplary configuration diagram of a clock generation section of the first write control code generation unit shown in FIG. 6 and a timing diagram illustrating internal operations of the clock generation section.

FIG. 8 is a configuration diagram of the clock generation section of the first write control code generation unit shown in FIG. 6B and a timing diagram illustrating internal operations of the clock generation section.

Referring to FIG. 8, the clock generation section 220 includes a ring oscillator which is composed of a NAND gate NAND1 and a plurality of inverters INV1 through INV5. Referring to a timing diagram 220_0, the clock generation section 220 generates a clock signal CK in response to the clock enable signal CKEN. Namely, the clock generation section 220 outputs the clock signal CK which toggles while the clock enable signal CKEN is activated. For reference, although not shown in a drawing, the clock generation section 220 may be configured to change a toggling cycle of the clock signal CK under the control of a cycle control signal. This configuration can control the toggling cycle of the clock signal CK and change a cycle of a counting operation of the counter section 230, and can be applied to the semiconductor memory apparatus in accordance with the exemplary embodiment shown in FIG. 5.

Figure 9:
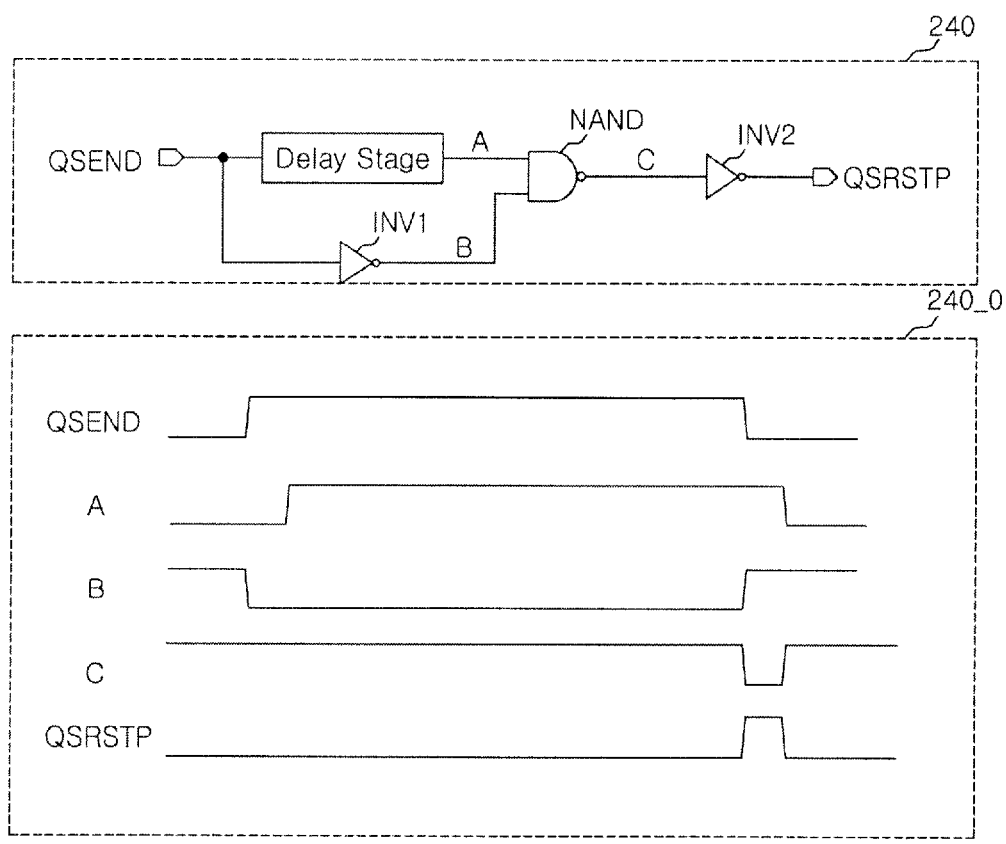
FIG. 9 is an exemplary configuration diagram of a latch reset pulse generation section of the first write control code generation unit shown in FIG. 6 and a timing diagram illustrating internal operations of the latch reset pulse generation section.

FIG. 9 is a configuration diagram of the latch reset pulse generation section of the first write control code generation unit shown in FIG. 6B and a timing diagram illustrating internal operations of the latch reset pulse generation section. The latch reset pulse generation section 240 is configured to generate the latch reset pulse signal QSRSTP when the counting codes reach a certain value.

Referring to FIGS. 9 and 6B, when a signal QSEND outputted from a 1 bit counter 237 (i.e., a 1 bit counter for detecting an end of a set programming), which receives a signal ENB6 outputted from a most significant 1 bit counter 236, is activated to a low level, the latch reset pulse generation section 240 generates the latch reset pulse signal QSRSTP which pulses to a high level, using the signal QSEND. That is to say, after the signal QSEND outputted from the 1 bit counter 237 is delayed through a delay stage, the signal which pulses to the high level is generated by NANDing the delayed signal and an inverted signal of the signal QSEND.

Figure 10:
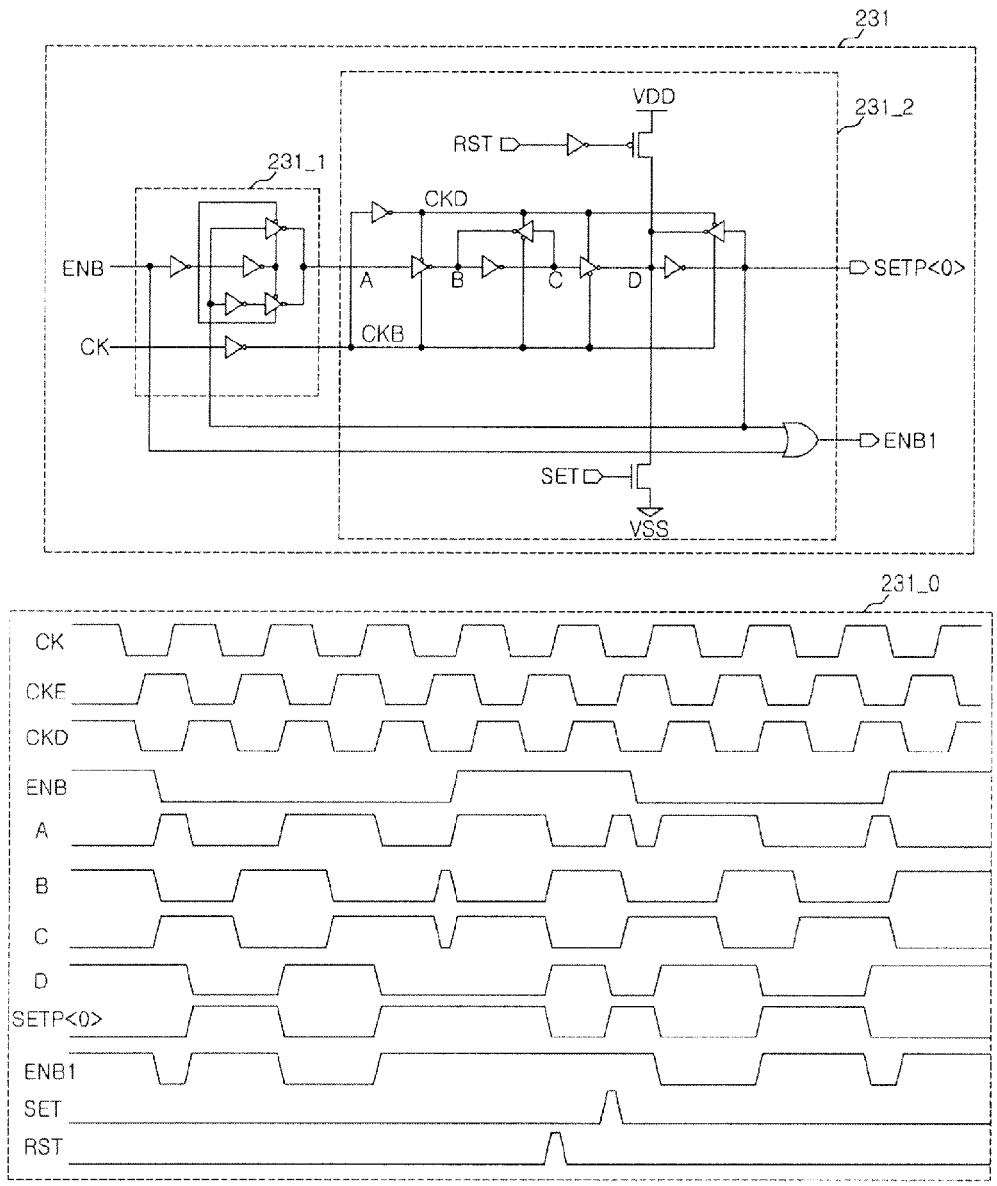
FIG. 10 is an exemplary configuration diagram of a counter section of the first write control code generation unit shown in FIG. 6 and a timing diagram illustrating internal operations of the counter section.

FIG. 10 is a configuration diagram of the counter section of the first write control code generation unit shown in FIG. 6B and a timing diagram illustrating internal operations of the counter section.

Referring to FIGS. 10 and 6, the counter section 230 generates the counting codes, which are counted under the control of the programming enable signal DPGMP, the count enable signal ENB and the clock signal CK, and outputs the counting codes as the first write control codes SETP<N:1>. In other words, when the count enable signal ENB is activated to the low level, the counter section 230 performs a counting operation in response to the clock signal CK. The counter section 230 is composed of a plurality of 1 bit counters 231 through 237 and performs a down counting operation.

FIG. 10 representatively shows a least significant 1 bit counter 231 among the plurality of 1 bit counters 231 through 237 which constitute the counter section 230.

Referring to FIG. 10, the 1 bit counter 231 includes a signal input part 231_1 and a latch part 231_2.

The signal input part 231_1 determines a signal level of an input node A of the latch part 231_2 in response to the count enable signal ENB and the first counting code SETP<0>.

The latch part 231_2 latches a signal outputted from the signal input part 231_1 in response to the clock signal CK and outputs the first counting code SETP<0> and a borrow signal ENB1. The borrow signal ENB1 is used as a count enable signal ENB of the second 1 bit counter 232. An internal node of the latch part 231_2 may be initialized or changed to a specified level in response to a reset signal RST and a set signal SET.

Figure 11:
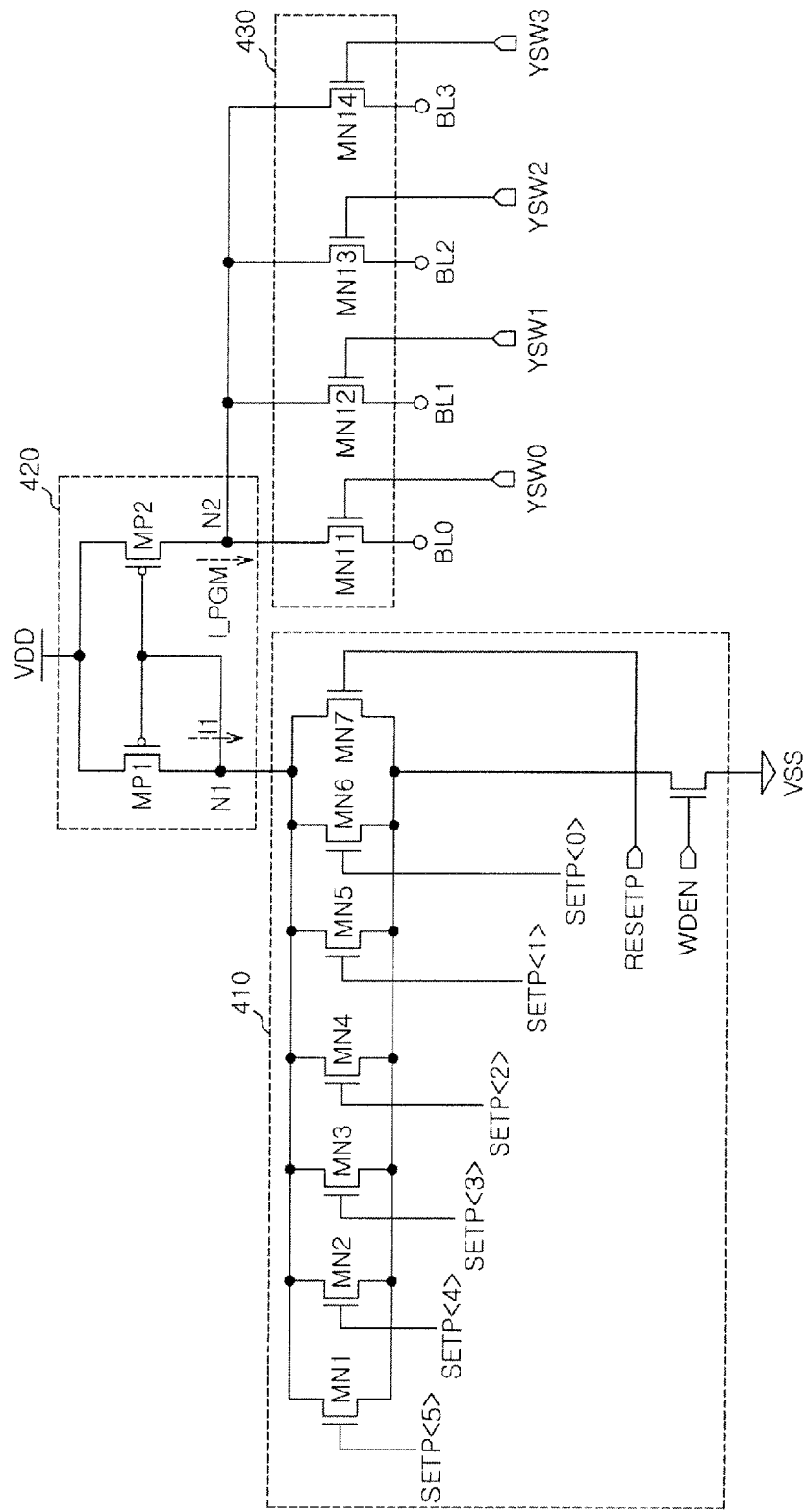
FIG. 11 is an exemplary configuration diagram illustrating an exemplary embodiment of a data write unit.

FIG. 11 is a configuration diagram illustrating an exemplary embodiment of a data write unit.

Referring to FIG. 11, the data write unit 400 includes a current control section 410, a current driving section 420 and a selection section 430.

The current control section 410 is configured to control a first current I1 according to a code combination of the first write control codes SETP<N:0> and the second write control code RESETP when a write enable signal WDEN is activated. Here, a plurality of NMOS transistors MN1 through MN6, which are controlled by the first write control codes SETP<N:0>, are selectively turned on in response to the code combination of the first write control codes SETP<N:0>. Therefore, the first current is controlled depending on the a code combination of the first write control codes SETP<N:0> and the second write control code RESETP. According to an example, the first write control codes SETP<N:0> are signals which are cyclically updated, and the second write control code RESETP may be a signal which is inputted in a pulse type.

The current driving section 420 is configured to drive a programming current pulse I_PGM corresponding to the first current I1, to an output terminal N2. According to this exemplary embodiment, the current driving section 420 is configured to drive a programming current pulse I_PGM equal to the first current I1. The programming current pulse I_PGM may be classified into a first programming current pulse (i.e., "set" programming current pulse) corresponding to the first write control codes SETP<N:0> and a second programming current pulse (i.e., "reset" programming current pulse) corresponding to the second write control code RESETP.

The selection section 430 is configured to output the programming current pulse I_PGM driven from the current driving section 420 to bit lines BL0 through BL3 which respectively respond to a plurality of select signals YSW<0:3>.

Figure 12:
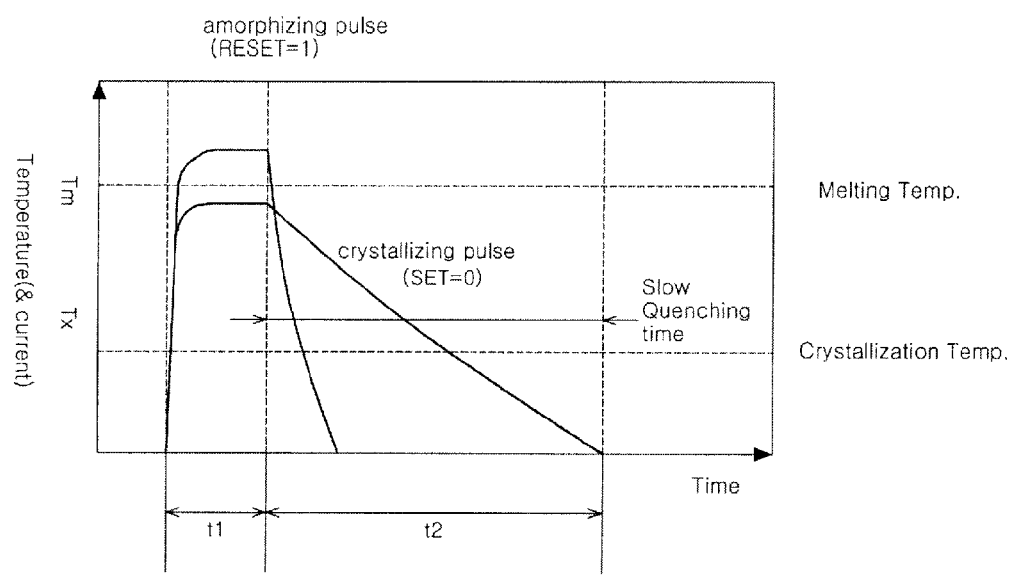
FIG. 12 is a graph showing programming current pulses outputted from the data write unit shown in FIG. 11.

FIG. 12 is a graph showing programming current pulses outputted from the data write unit shown in FIG. 11.

Referring to FIG. 12, the second programming current pulse is driven to be higher than a melting temperature for a short time, and the first programming current pulse is driven to be close to the melting temperature for an initial first pulse time t1 and gradually decrease for a second pulse time t2. For reference, in the graph, the second programming current pulse is shown as an amorphizing pulse, and the first programming current pulse is shown as a crystallizing pulse.

Figure 13:
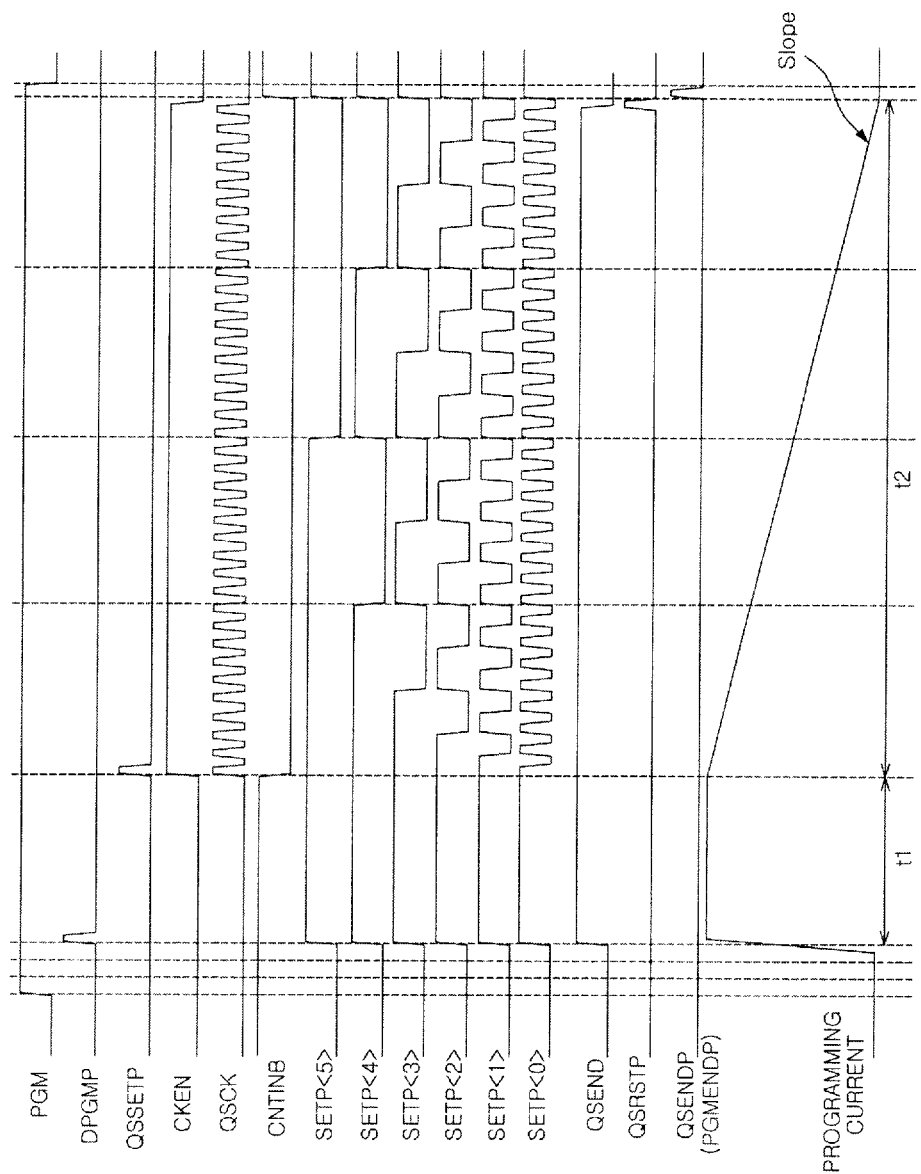
FIG. 13 is a timing diagram illustrating internal operations of the semiconductor memory apparatus in accordance with the exemplary embodiment of the present invention.

FIG. 13 is a timing diagram illustrating internal operations of the semiconductor memory apparatus in accordance with the exemplary embodiment of the present invention.

Operations of the semiconductor memory apparatus in accordance with the exemplary embodiment of the present invention will be described below with reference to FIG. 13.

First, during a period from when the programming enable signal DPGMP pulses to the high level to when the period control signal QSSETP pulses to the high level, the first write control codes SETP<N:0> maintain an initial value, and an initial programming current pulse I_PGM, which has a magnitude corresponding to an initial code combination of the first write control codes SETP<N:0>, is driven. For reference, by controlling a pulsing timing of the period control signal QSSETP, a driving time of the initial programming current pulse I_PGM may be controlled.

Next, after the period control signal QSSETP pulses to the high level, the first write control codes SETP<N:0> are cyclically updated. Accordingly, the programming current pulse I_PGM, which has a magnitude corresponding to a code combination of the updated first write control codes SETP<N:0>, is driven. Here, the magnitude of the programming current pulse I_PGM gradually decreases. In addition, by changing the update cycle of the first write control codes SETP<N:0>, a time for which the programming current pulse I_PGM decreases may be changed. In other words, a slope, at which the programming current pulse I_PGM decreases, may be controlled.

If the latch reset pulse signal QSRSTP is activated to a high level, the driving of the programming current pulse I_PGM is interrupted.

As can be readily seen from the above description, a programming current pulse of a semiconductor memory apparatus, which is configured to program data to a memory cell through Joule heating induced by a programming current pulse, is generated through the steps of generating first write control codes which are cyclically updated for a certain time, and outputting a first programming current pulse which has a magnitude corresponding to a code combination of the first write control codes. The first programming current pulse raises a temperature of a memory cell for an initial first pulse time t1 to, for example, a temperature lower than a melting temperature and higher than a crystallization temperature, and gradually lowers a temperature of the memory cell for a second pulse time t2 after the first pulse time t1 to a temperature lower than the crystallization temperature. The second pulse time of the first programming current pulse may be longer than the first pulse time. For reference, the method for generating a programming current pulse in a semiconductor memory apparatus may further include the steps of generating a second write control code which is activated for a certain time, and outputting a second programming current pulse which raises a temperature of the memory cell to a temperature higher than the melting temperature, in response to the second write control code. Here, the first programming current pulse is characterized in that it is outputted for a longer time than the second programming current pulse. Also, the method for generating a programming current pulse in a semiconductor memory apparatus may further include the step of controlling an update cycle of the first write control codes according to a cycle control signal. If the update cycle of the first write control codes is controlled, e.g., if a period of the cycle increases, a slope of a graph of the programming current pulse decreases.

As described above, by controlling a slope at which the programming current pulse decreases for the second pulse time t2, a programming operation may be precisely performed.

As is apparent from the above description, the semiconductor memory apparatus and the method for generating a programming current pulse in accordance with the embodiments of the present invention provide advantages in that a programming time, e.g., a set programming time can be controlled/shortened.

So far, embodiments of the present invention have been described in detail. For reference, embodiments including additional component elements, which are not directly associated with the spirit of the present invention, may be exemplified in order to describe the present invention in further detail. Moreover, an active high configuration or an active low configuration for indicating the activated states of signals and circuits may vary depending upon an embodiment. Also, while the bit number of first write control codes is limited to clearly explain the spirit of the present invention, it is to be understood that the bit number may be changed depending upon an embodiment. If the bit number of the first write control codes increases, a slope with which a programming current pulse may decrease becomes more linear. Since such embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus and the method for generating a programming current pulse described herein should not be limited based on the described embodiments. Rather, the semiconductor memory apparatus and the method for generating a programming current pulse described herein should only be limited in light of the claims that follow when taken in conjunction with the above description and accompanying drawings.

What is claimed is:

1. A semiconductor memory apparatus comprising:
    a first write control code generation unit configured to generate first write control codes which have fixed value for a first time and are cyclically updated after the first time;
    a second write control code generation unit configured to generate a second write control code; and
    a data write unit configured to output a first programming current pulse in response to the first write control codes, or a second programming current pulse in response to the second write control code.

2. The semiconductor memory apparatus according to claim 1, wherein the first write control codes are cyclically updated for a time longer than an activation time of the second write control code.

3. The semiconductor memory apparatus according to claim 1, wherein the first programming current pulse maintains a first current value for the first time, and gradually decreases in current value for a second time after the first time.

4. The semiconductor memory apparatus according to claim 1, wherein the first write control code generation unit comprises:
    an input latch section configured to output a count enable signal and a clock enable signal in response to a period control signal and a reset pulse signal;
    a clock generation section configured to generate a clock signal in response to the clock enable signal;
    a counter section configured to generate a counting codes in response to the count enable signal and the clock signal, and output the counting codes as the first write control codes; and
    a latch reset pulse generation section configured to generate a latch reset pulse signal when the counting codes reach a predetermined value.

5. The semiconductor memory apparatus according to claim 1, wherein the data write unit comprises:
   a current control section configured to control a current according to a code combination of the first write control codes and the second write control code; and
   a current driving section configured to drive the first programming current pulse or the second programming current pulse, with a magnitude corresponding to the current.

6. The semiconductor memory apparatus according to claim 5, wherein the data write unit further comprises:
   a selection section configured to output the programming current pulse driven from the current driving section to bit lines which respectively correspond to a plurality of select signals.

7. The semiconductor memory apparatus according to claim 1, further comprising:
   a cycle control signal output unit configured to output a cycle control signal,
   wherein the first write control code generation unit changes an update cycle of the first write control codes in response to the cycle control signal.

8. The semiconductor memory apparatus according to claim 7, wherein the first write control codes are cyclically updated for a time longer than an activation time of the second write control code.

9. The semiconductor memory apparatus according to claim 7, wherein the first programming current pulse maintains a first current value for the first time, and gradually decreases in current value for a second time after the first time.

10. The semiconductor memory apparatus according to claim 7, wherein the first write control code generation unit comprises:
    an input latch section configured to output a count enable signal and a clock enable signal in response to a period control signal and a reset pulse signal;
    a clock generation section configured to generate a clock signal which is controlled in a toggling cycle thereof, in response to the clock enable signal and the cycle control signal;
    a counter section configured to generate a counting codes in response to the clock signal, and output the counting codes as the first write control codes; and
    a latch reset pulse generation section configured to generate a latch reset pulse signal when the counting codes reach a predetermined value.

11. The semiconductor memory apparatus according to claim 7, wherein the data write unit comprises:
    a current control section configured to control a current according to a code combination of the first write control codes and the second write control code; and
    a current driving section configured to drive the first programming current pulse or the second programming current pulse, with a magnitude corresponding to the current.

12. The semiconductor memory apparatus according to claim 11, wherein the data write unit further comprises:
    a selection section configured to output the programming current pulse driven from the current driving section to bit lines which respectively correspond to a plurality of select signals.

13. A method for generating a programming current pulse in a semiconductor memory apparatus configured to program data to a memory cell through Joule heating induced by a programming current pulse, the method comprising the steps of:
    generating first write control codes which are cyclically updated; and
    outputting a first programming current pulse which has a magnitude corresponding to a code combination of the first write control codes,
    wherein the first programming current pulse raises and maintains a temperature of a memory cell for a first time to a temperature lower than a melting temperature and higher than a crystallization temperature, and gradually lowers a temperature of the memory cell for a second time after the first time to a temperature lower than the crystallization temperature.

14. The method according to claim 13, wherein the second time of the first programming current pulse is longer than the first time.

15. The method according to claim 13, further comprising the steps of:
    generating a second write control code; and
    outputting a second programming current pulse which raises a temperature of the memory cell to a temperature higher than the melting temperature, in response to the second write control code.

16. The method according to claim 15, wherein the first programming current pulse is outputted for a longer time than the second programming current pulse.

17. The method according to claim 13, further comprising the step of:
    controlling an update cycle of the first write control codes according to a cycle control signal.

18. A semiconductor memory apparatus comprising:
    a quenching control code generation unit configured to generate a binary quenching control code which has more first value at a beginning of a program operation than at an end of the program operation; and
    a data write unit configured to generate a program current in response to the binary quenching control code.

19. The semiconductor memory apparatus according to claim 18, wherein the first value is "1", and the data write unit includes a program current control unit comprising a plurality of NMOS pass gate arranged in parallel.

* * * * *